(12) United States Patent
Fujiwara

(10) Patent No.: US 7,232,555 B2
(45) Date of Patent: Jun. 19, 2007

(54) AlGaInN SINGLE-CRYSTAL WAFER

(75) Inventor: Shinsuke Fujiwara, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 25 days.

(21) Appl. No.: 10/908,922

(22) Filed: Jun. 1, 2005

(65) Prior Publication Data

US 2005/0268842 A1 Dec. 8, 2005

(30) Foreign Application Priority Data

Jun. 4, 2004 (JP) .............................. 2004-167377

(51) Int. Cl.
*C01B 33/26* (2006.01)
(52) U.S. Cl. ..................................... 423/328.2; 117/85
(58) Field of Classification Search ............. 423/328.2; 117/85

See application file for complete search history.

(56) References Cited

U.S. PATENT DOCUMENTS

| 5,858,086 A | 1/1999 | Hunter |
| 6,063,185 A | 5/2000 | Hunter |
| 6,596,079 B1 | 7/2003 | Vaudo et al. |

OTHER PUBLICATIONS

I. Yonenaga, et al., "High-Temperature Hardness of Bulk Single-Crystal AlN," Japanese Journal of Applied Physics, vol. 40, 2001, pp. L426-427.

R. Schlesser, et al., "Seeded Growth of AlN Bulk Single Crystals by Sublimation," Journal of Crystal Growth, Jun. 2002, pp. 416-420, vol. 241, No. 4, North-Holland, Amsterdam, NL.

*Primary Examiner*—Felisa Hiteshew
(74) *Attorney, Agent, or Firm*—James W. Judge

(57) ABSTRACT

AlGaInN single-crystal wafer with alleviated cracking and improved utilization rate and cost effectiveness. A hexagonal $Al_xGa_yIn_{1-(x+y)}N$ ($0<x\leq1$, $0\leq y<1$, $x+y\leq1$) single-crystal wafer, characterized in that the wafer has a thickness T(cm) and a principal face with a surface area S(cm$^2$), the area S and thickness T satisfying the conditions $S\geq10$ cm$^2$ and $0.006S\geq T\geq0.002S$.

7 Claims, 1 Drawing Sheet

AlGaInN SINGLE-CRYSTAL WAFER

BACKGROUND OF THE INVENTION

1. Field of the Invention

The present invention relates to semiconductor single-crystal wafers that can be used as substrates of various electronic devices, and more particularly to alleviation of cracking and improvement in cost effectiveness in utilizing compound semiconductor single-crystal wafers, which are relatively liable to crack.

2. Background Art

Semiconductor single-crystal wafers, when used as substrates for semiconductor electronic devices, must as a matter of course be impervious to cracking during the process of manufacturing the semiconductor electronic devices. The reason is that a semiconductor single-crystal wafer that has cracked in the course of a process cannot be put through subsequent processing, meaning that the wafer goes to waste.

In addition to silicon single-crystal wafers, wafers of single-crystal semiconductor compounds have been utilized in recent years as substrates to produce various electronic devices. Among such compound semiconductor single crystals, hexagonal $Al_xGa_yIn_{1-(x+y)}N$ ($0<x\leq1$, $0\leq y<1$, $x+y\leq1$) single crystal is a preferable candidate material for manufacturing various electronic devices. It should be noted that in the present specification, "$Al_xGa_yIn_{1-(x+y)}N$ ($0<x\leq1$, $0\leq y<1$, $x+y\leq1$) semiconductor" will also be referred to as AlGaInN semiconductor for short.

As mentioned in the Japanese Journal of Applied Physics, Vol. 40, 2001, pp. L426–L427, AlGaInN single crystal has a lower fracture toughness than silicon single crystal and therefore tends to be liable to crack. In particular, AlN substrates are liable to crack during handling since they have a low fracture toughness, on the order of a fraction of that of SiC substrates and sapphire substrates.

Growing an AlGaInN single crystal of large diametric span has conventionally been difficult in comparison with growing a silicon single crystal, and an AlN single crystal of large diametric span has been particularly difficult to grow. In recent years, however, growing a single crystal of AlN into a relatively large diametric span is becoming feasible.

When the principal faces of a semiconductor wafer have a small area, the weight of the wafer is accordingly small and shock acting on the wafer during processing will be small, and thus likelihood that the wafer will crack during processing is low. For this reason, when a semiconductor wafer has a small diameter, the thickness of the wafer is determined based on requirements for easier wafer handling. For example, too thin a wafer thickness causes difficulty in picking up the wafer with pincers, so the thickness of the wafer is set to be such a thickness that the wafer can be easily picked up with pincers.

In contrast, when a wafer has a large diametric span, the weight accordingly increases and shock acting on the wafer also tends to be large; therefore, the requirements arising from the perspective of making the wafer impervious to cracking become more important than the requirements necessary for easy wafer handling. In other words, it is desirable that as the area of the principal faces of a wafer becomes larger, the thickness of the wafer be made greater in order to make the wafer impervious to cracking.

Nevertheless, although increasing the thickness of the wafer makes cracking less likely to occur even with wafers of large diametric span, the efficiency in utilizing the semiconductor single-crystal as substrates for producing electronic devices drops, which is undesirable in terms of cost effectiveness.

BRIEF SUMMARY OF THE INVENTION

Accordingly, an object of the present invention is, in using as a substrate for electronic devices an AlGaInN single-crystal wafer, which is more susceptible to cracking than silicon single-crystal wafers, to alleviate cracking in, and improve the utilization rate and cost effectiveness of, the AlGaInN single-crystal wafer.

A hexagonal $Al_xGa_yIn_{1-(x+y)}N$ ($0<x\leq1$, $0\leq y<1$, $x+y\leq1$) single-crystal wafer according to the present invention is characterized in that the wafer has a thickness T (cm) and principal faces with a surface area S(cm$^2$), and the area S and thickness T satisfy the conditions $S\geq10$ cm$^2$ and $0.006S\geq T\geq0.002S$.

In implementations in which the principal face of the wafer has an elliptical shape, deviating from a circular shape, the area S may be obtained as the area of a circle the diameter of which is the major axis of the ellipse; and in implementations in which the principal face of the wafer has a rectangular shape, deviating from a square shape, the area S may be obtained as the area of a square one side of which is the longer side of the rectangle.

It is preferable that the full width at half maximum of an X-ray rocking curve measuring diffraction from the (0002) surface of the wafer be 300 seconds or less.

It is preferable that one of the principal faces of the wafer be mirror-polished and the other one of the principal faces be lapped. It is more preferable that both of the principal faces of the wafer be mirror-polished. It is still more preferable that the peripheral edge of the wafer be ground.

DETAILED DESCRIPTION OF THE INVENTION

AlGaInN single-crystal wafers are more liable to crack than silicon single-crystal wafers, and among the AlGaInN single-crystal wafers, AlN single-crystal wafers have the lowest fracture toughness. The present inventors carried out a breakage test concerning the AlN single-crystal wafer. For the breakage test, wafers with various thicknesses were prepared from an AlN single crystal grown by sublimation deposition. All the wafers had substantially circular principal faces, which had a (0001) surface orientation and an area of 10 cm$^2$.

Figure 1:
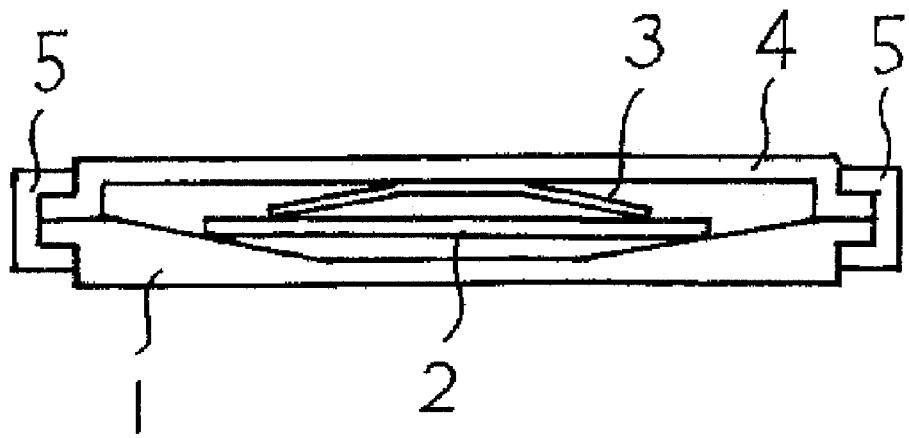
FIG. 1 is a schematic cross-sectional view illustrating a wafer tray used for a wafer breakage test carried out in the present invention.

FIG. 1 illustrates a schematic cross-sectional view of a wafer tray used for the breakage test. The wafer tray was one designed for 1.5 inch-diameter wafers, made by Fluoroware Inc, and all the components of the tray were formed of Teflon™.

An AlN single-crystal wafer 2 was placed onto a dish 1 in the wafer tray shown in FIG. 1. On the AlN wafer 2 a leaf spring 3 made of Teflon™ was placed, over which a cover 4 was placed. The cover 4 was secured to the tray 1 with clasps 5. In this state, the wafer tray was dropped from a height of 50 cm onto a concrete floor, and whether or not the AlN wafer 2 cracked in the wafer tray was thus investigated.

As a result of the breakage test in the above-described manner, it was found that AlN single-crystal wafers having principal faces with an area of 10 cm$^2$ rarely cracked when the wafers had a thickness of 0.02 cm or greater.

Cracking in a wafer can occur when a certain stress acts on microfractures that exist in a wafer surface. It is impossible to eliminate such microfractures from a wafer completely, but the size of the fractures does not depend much on the size of the wafer. Therefore, in order to prevent the wafer from cracking, it is necessary to have the stress that acts on the wafer be a certain value or less.

From knowledge in the strength of materials, it will be readily understood that the stress that acts on a wafer is proportional to the area of the wafer and inversely proportional to the thickness. Accordingly, in order to prevent a wafer from cracking, it is desirable that the thickness of the wafer be increased so as to be proportional to increase in the surface area of the wafer. Meanwhile, taking into consideration insight, based on the results of the breakage test, that a wafer having an area of 10 cm$^2$ is impervious to cracking when it has a thickness of 0.02 cm, it is also desirable that wafer thickness T(cm) and wafer area S(cm$^2$) satisfy the relationship $0.002S \leq T$ On the other hand, the greater the wafer thickness is, the more impervious to cracking will the wafer be. However, the number of wafers that can be obtained per semiconductor single-crystal ingot consequently decreases, reducing the semiconductor single-crystal utilization rate. This is undesirable in terms of cost effectiveness. Accordingly, from the perspective of cost effectiveness regarding the number of wafers obtained per semiconductor single-crystal, it is desirable that the thickness of a wafer be no more than three times that of the minimum thickness of the wafer that is required for preventing cracking of the wafer; in other words, it is desirable that the relationship $T \leq 0.006S$ be satisfied.

Figure 2:
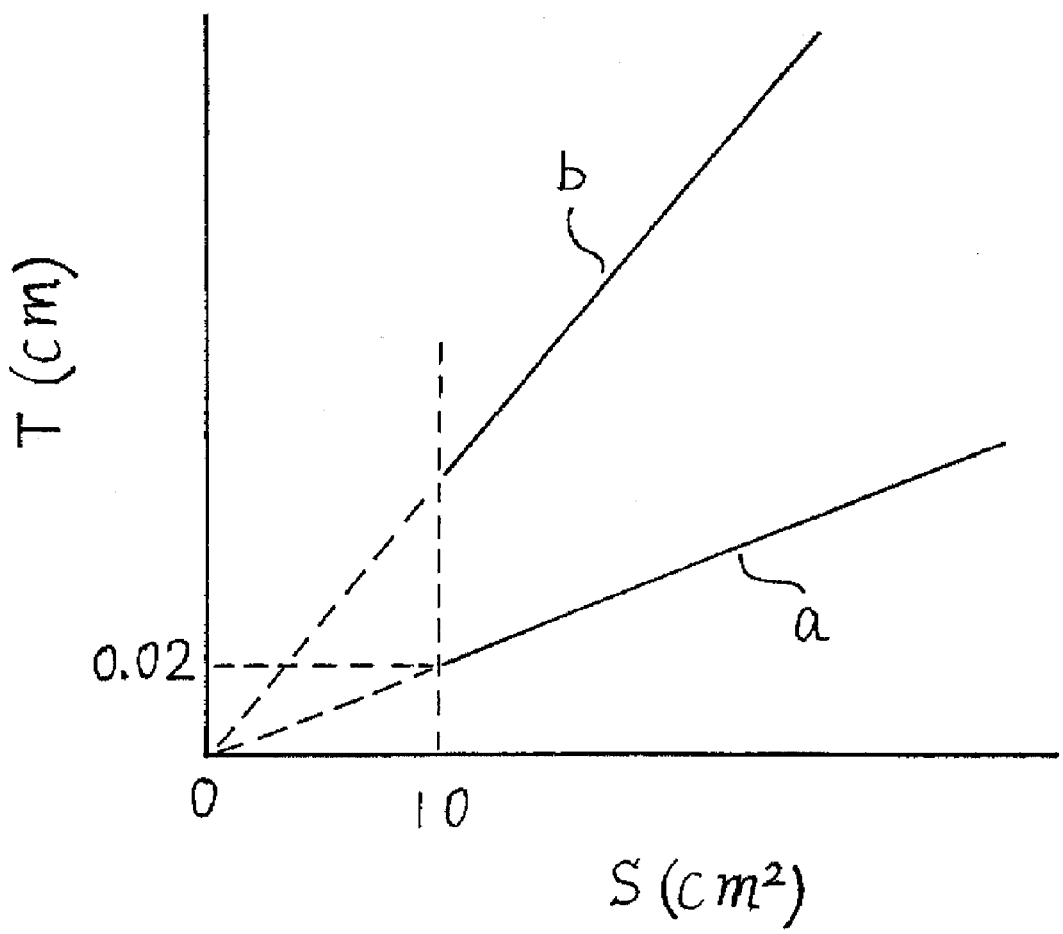
FIG. 2 is a graph illustrating a thickness T and surface area S relationship that in order to prevent AlGaInN single-crystal wafer from cracking is desirably satisfied.

The graph of FIG. 2 sets forth the results that were found by the present invention. In this graph, the horizontal axis represents the surface area S(cm$^2$) of AlN single-crystal wafers and the vertical axis represents the thickness T(cm) of the wafers. Also in the graph, the straight line (a) indicates the relationship T=0.002S and the straight line (b) indicates the relationship T=0.006S. Thus, according to the present invention, it is desirable that an AlN single-crystal wafer have a thickness T and a surface area S that exist within the region between the straight lines (a) and (b).

It should be noted that cracking of a semiconductor wafer can be dependant on the size (depth) of the fractures existing in the surface. Accordingly, in order to reduce the depth of the fractures, it is preferable that at least the wafer frontside be mirror-polished (planarized) and the backside be at least lapped. It is more preferable, as a matter of course from the perspective of preventing cracking, that the wafer backside also be planarized. More preferable is that not only both principal faces of the wafer be polished, but also that the edge face of the wafer be also subjected to a grinding process to eliminate fractures. Although the way of polishing the wafer is not particularly limited and any method may be employed, it is advisable that the polishing be conducted by, for example, supplying an abrasive agent such as diamond or alumina on an abrasive plate or an abrasive cloth. The grinding of the peripheral edge of the wafer may be conducted by grinding using a grindstone, or by polishing using a polishing slurry.

Cracking of a semiconductor wafer can be affected by not only external shock, but also by residual internal stress within the wafer itself. Of course, from the perspective of preventing wafer cracking, the residual internal stress should be minimal. The magnitude of the internal stress can be evaluated by means of the full width at half maximum from X-ray diffraction. Specifically, a larger internal stress causes wafer warpage, resulting in a greater full width at half maximum. From the perspective of preventing cracking in wafers, it is preferable that the full width at half maximum of an X-ray rocking curve measuring the (0002) surface diffraction of the wafer be 300 seconds or less.

The foregoing embodiment of the present invention has discussed mainly an AlN single-crystal wafer as an illustrative example, but those skilled in the art will appreciate that the present invention is similarly applicable to an $Al_xGa_yIn_{1-(x+y)}N$ ($0<x \leq 1$, $0 \leq y<1$, $x+y \leq 1$) single-crystal wafer, in which part of the AlN is replaced by Ga and/or In. In addition, although the (0001) plane has been illustrated as an example of the orientation of the wafer principal faces, the present invention is similarly applicable to a wafer the principal faces of which are in the (10$\bar{1}$0) plane, the (11$\bar{2}$0) plane, the (10$\bar{1}$1) plane, or a plane inclined by a given angle from these planes.

The foregoing embodiment has described a wafer having substantially circular principal faces; however, when the principal faces of the wafer have an elliptical shape, deviating from a circular shape, the area S can be obtained as the area of the circle the diameter of which is the major axis of the ellipse. When the principal face of the wafer has a rectangular shape, deviating from a square shape, the area S can be obtained as the area of the square one side of which is the longer side of the rectangle.

An $Al_xGa_yIn_{1-(x+y)}N$ ($0<x \leq 1$, $0 \leq y<1$, $x+y \leq 1$) single-crystal wafer according to the present invention such as described above is impervious to breakage during processing and therefore may be used suitably for producing various electronic devices, such as light-emitting diodes, laser diodes, rectifiers, bipolar transistors, field effect transistors, HEMTs (high electron mobility transistors), temperature sensors, pressure sensors, radiation sensors, visible ray/ultraviolet ray sensors, and surface acoustic wave devices.

As has been described, the present invention makes it possible to prevent cracking in an AlGaInN single-crystal wafer of large diametric span and improve its utilization rate and cost effectiveness. Moreover, using the AlGaInN single-crystal wafer of large diametric span, various electronic devices can be produced efficiently and cost-effectively.

What is claimed is:

1. A hexagonal $Al_xGa_yIn_{1-(x+y)}N$ ($0 <x \leq 1$, $0 \leq y <1$, $x+y$ 1) single-crystal wafer, characterized by the following property:

letting the wafer thickness be T (cm) and the surface area of the wafer's principal face be S (cm$^2$), then the area S and thickness T satisfy the conditions $S \geq 10$ cm$^2$ and $0.006S \geq T \geq 0.002S$.

2. An AlGaInN single-crystal wafer as set forth in claim 1, wherein:
the perimeter of the principal face of the wafer is in the form of an ellipse, deviating from being circular in form; and
the area S is obtained as the area of a circle the diameter of which is the major axis of the ellipse, 3. The AlGaInN single-crystal wafer as set forth in claim 1, wherein the full width at half maximum of an X-ray rocking curve measuring the (0002) surface diffraction of the wafer is 300 seconds or less.

4. The AlGaInN single-crystal wafer as set forth in claim 1, wherein one of the principal faces of the wafer is planarized and the other of the principal faces is lapped.

5. The AlGaInN single-crystal wafer as set forth in claim 1, wherein both the principal faces of the wafer are planarized.

6. The AlGaInN single-crystal wafer as set forth in claim 1, wherein the peripheral edge of the wafer is ground.

7. An AlGaInN single-crystal wafer as set forth in claim 1, wherein:
   perimeter of the principal face of the wafer is in the form of a rectangle, deviating from being square in form; and
   the area S is obtained as the area of a square one side of which is the longer side of the rectangle.

* * * * *

UNITED STATES PATENT AND TRADEMARK OFFICE
CERTIFICATE OF CORRECTION

PATENT NO. : 7,232,555 B2  
APPLICATION NO. : 10/908922  
DATED : June 19, 2007  
INVENTOR(S) : Shinsuke Fujiwara Page 1 of 1

It is certified that error appears in the above-identified patent and that said Letters Patent is hereby corrected as shown below:

In Claim 1, Col. 4, lines 51-52, "x + y 1" should read --$x + y \leqq 1$--.

In Claim 7, Col. 6, line 3, "perimeter of" should read --the perimeter of--.

Signed and Sealed this

Fourth Day of December, 2007

JON W. DUDAS  
*Director of the United States Patent and Trademark Office*